United States Patent [19]

Traa

[11] Patent Number: 4,733,218

[45] Date of Patent: Mar. 22, 1988

[54] COMBINED DIGITAL-TO-ANALOG CONVERTER AND LATCH MEMORY CIRCUIT

[75] Inventor: Einar O. Traa, Portland, Oreg.

[73] Assignee: Tektronix, Inc., Beaverton, Oreg.

[21] Appl. No.: 888,199

[22] Filed: Jul. 18, 1986

[51] Int. Cl.[4] ............................................... H03M 1/78
[52] U.S. Cl. ........................ 340/347 DA; 340/347 CC; 340/347 M; 377/70; 377/75
[58] Field of Search ... 340/347 DA, 347 M, 347 AD, 340/347 C, 347 CC; 377/70, 75

[56] References Cited

U.S. PATENT DOCUMENTS 4,400,690 8/1983 Brokaw et al. .......... 340/347 DA X

OTHER PUBLICATIONS

The Engineering Staff of Analog Devices, Inc., Analog-Digital Conversion Handbook, 6/1972, pp. I-8 & I-9; II-46 to II-49.
Millman et al., Pulse and Digital Circuits, 1956, pp. 410-413.
"Bipolar and MOS Analog Integrated Circuit Design", Grebene, (Wiley-Interscience, New York, 1984), pp. 754-760, 826-827, and 846-848.

Primary Examiner—T. J. Sloyan
Attorney, Agent, or Firm—William S. Lovell; Paul S. Angello

[57] ABSTRACT

A combined digital-to-analog converter and latch memory circuit (10) includes an R-2R resistive ladder network (12) and a current-controlled latch memory 18. The R-2R resistive ladder network has plural input nodes (100 and 102) and an analog signal output (104). Each of the input nodes corresponds to a different bit of a digital word that is to be converted to an analog signal. The current-controlled latch memory includes plural subcircuits (14 and 16). Each of the latch subcircuits uses an amount of current to store the logic state of the bit of the digital word and to derive directly the node of the R-2R resistive ladder network. This configuration promotes the efficient use of space, power, and circuit elements.

4 Claims, 1 Drawing Figure

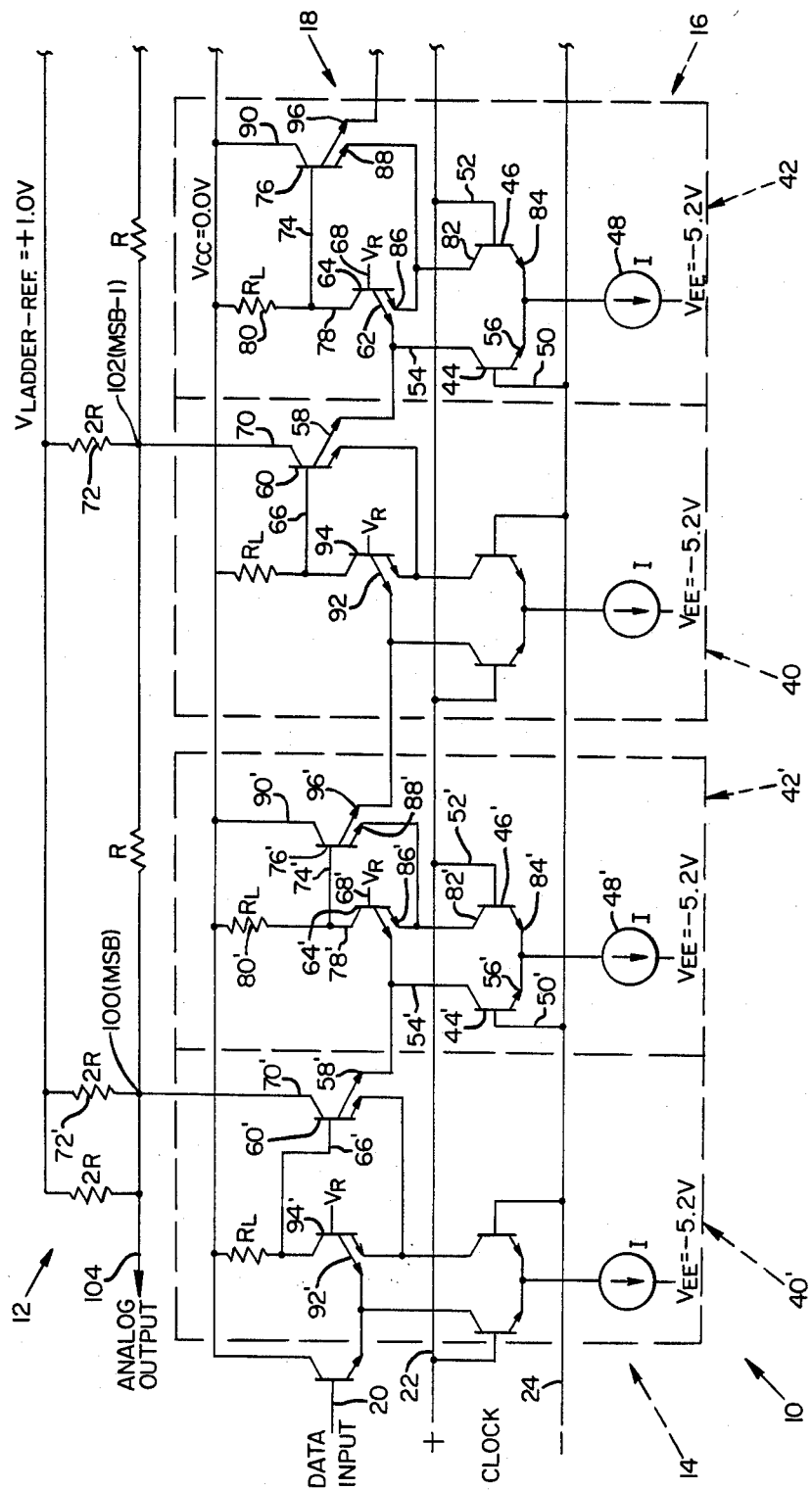

Combined Digital-to-Analog Converter and Latch Memory Circuit

BACKGROUND OF THE INVENTION

The present invention relates to digital-to-analog converters and, in particular, to a digital-to-analog converter circuit that combines a resistive ladder network of a conventional type with current-controlled latch memory subcircuits in a configuration that promotes the efficient use of space, power, and circuit elements.

One type of conventional digital-to-analog converter uses an R-2R resistive ladder network in cooperation with a number of current sources that equals the number of bits of a binary word which is to be converted to an analog output voltage. The logic state of each bit of the binary word is stored in a separate latch circuit. Each of the latch circuits drives a separate current source which in response to the logic state of the bit delivers a current signal of a predetermined amount to a corresponding input node of the R-2R resistive ladder network. The analog output voltage is a weighted sum of the signals representing the bits in the binary word.

A digital-to-analog converter circuit of this type suffers from the disadvantage requiring separate circuit elements to form the latch memory circuits and the constant-current sources. This type of circuit uses a number of circuit elements which occupy a relatively large amount of space, for example, on an integrated circuit substrate, and consume significant amounts of electrical power.

SUMMARY OF THE INVENTION

An object of the present invention is, therefore, to provide a digital-to-analog converter that promotes the efficient use of space, power, and circuit elements.

Another object of the invention is to provide such a digital-to-analog converter that combines the latch memory and current source in a single subcircuit for each bit in the digital word.

A further object of the invention is to provide such a digital-to-analog converter that uses an R-2R resistive ladder network to synthesize the analog output signal.

The present invention is a combined digital-to-analog converter and latch memory circuit. The circuit comprises a resistive ladder network that has plural input nodes and an analog output. Each of the input nodes corresponds to a different bit of a digital word that is to be converted to an analog signal. The circuit further comprises plural current-controlled latch subcircuits. Each of the latch subcircuits uses an amount of current to control the operation thereof and delivers the amount of current to one of the input nodes to represent the logic state of one of the bits of the digital word. The amount of current is, therefore, used to store the logic states of the bits of the digital word and to drive directly the resistive ladder network to synthesize an analog signal that corresponds to the weighted value of the digital word.

In a preferred embodiment, the resistive ladder network is of the R-2R type and the current-controlled latch subcircuits are implemented in emitter function logic (EFL) circuitry in the form of a serial loading shift register. Each of the EFL elements of the shift register is of conventional design and includes a master section and a slave section with emitter follower transistors. The collectors of the emitter follower transistors in the master sections are connected directly to the input nodes of the R-2R resistive ladder network, and the collectors of the emitter follower transistors in the slave sections are connected directly to a collector bias supply voltage. The bits of the digital word are loaded serially into the shift register in response to an applied clock signal. Proper calibration of the amount of current delivered by the EFL circuitry promotes the operation of the shift register as a latch memory and as a current source that drives the R-2R resistive ladder network.

Additional objects and advantages of the present invention will be apparent from the following detailed description of a preferred embodiment thereof, which proceeds with reference to the accompanying drawing.

BRIEF DESCRIPTION OF THE DRAWING

FIG. 1 is an electrical circuit schematic diagram of the digital-to-analog converter circuit of the present invention.

DETAILED DESCRIPTION OF A PREFERRED EMBODIMENT

FIG. 1 is a diagram of a preferred embodiment of the combined digital-to-analog converter and latch memory circuit 10 of the present invention. FIG. 1 shows a section of an R-2R resistive ladder network 12 of conventional design and two subcircuits 14 and 16 of a current-controlled latch memory 18 that is implemented in circuitry of the EFL type. The number of subcircuits of latch memory 18 equals the number "N" of bits in the binary word to be converted to an analog signal.

The subcircuits of latch memory 18 are connected to form a serial loading shift register. The bits of the digital word are applied in a serial stream to a data input 20 of subcircuit 14. These data bits shift progressively to the right to the next adjacent subcircuit in response to a differential voltage clock signal that is applied across a positive input terminal 22 and a negative input terminal 24. The data are loaded into latch memory 18 as the clock signal completes a transition from a logic 1 state to a logic 0 state. The digital word is completely loaded into latch memory 18 after N number of such transitions.

The subcircuits included in latch memory 18 are of the same conventional EFL circuit design and operate in the same manner. The following description is directed, therefore, only to the operation of subcircuit 16. Corresponding components of subcircuit 14 and of ladder network 12 are designated with identical reference numerals followed by primes. (Certain components in subcircuits 14 and 16 are undesignated because they need not be considered for the analysis presented below.)

Subcircuit 16 is divided into a master section 40 and a slave section 42. Slave section 42 includes emitter coupled transistors 44 and 46 through which a constant current, "I", flows from a constant-current source 48. The base terminal 50 of transistor 44 is connected to negative input terminal 24, and the base terminal 52 of transistor 46 is connected to positive input terminal 22.

Whenever the clock signal is in a logic 0 state, i.e, the voltage signal applied to negative input terminal 24 is of sufficient magnitude to bias transistor 44 in the forward active region, the current "I" flows from the collector 54 to the emitter 56 of transistor 44. The current flowing through collector 54 of transistor 44 flows through either the emitter 58 of transistor 60 or the emitter 62 of transistor 64. This is determined by the magnitude of the voltage on the base 66 of transistor 60.

If the voltage on base 66 of transistor 60 is greater than the reference voltage, $V_R$, on the base 68 of transistor 64, the current "I" flows through transistor 60 and no current flows through transistor 64. In a preferred embodiment, the collector bias voltage, $V_{CC}$, equals 0 volts and the voltage $V_R$ equals $-0.3$ volt. Under these conditions, the current "I" flows through the collector 70 of transistor 60, which is connected to the resistor 72 of value "2R" of ladder network 12. This indicates that a logic 1 is stored in subcircuit 16. The voltage on the base 74 of the transistor 76 is zero volts because the collector 78 of transistor 64 is connected to $V_{CC}$ through the resistor 80, through which no current flows.

If the voltage on base 66 of transistor 60 is less than (i.e. is about $-0.6$ volt) the voltage $V_R$ on base 68 of transistor 64, the current "I" flows through transistor 64 and no current flows through transistor 60. This indicates that a logic 0 is stored in subcircuit 16. Under these conditions, the current "I" flows through collector 78 of transistor 64 and causes about $-0.6$ volt to appear on base 74 of transistor 76.

The foregoing description assumes that the current "I" does not diminish as a function of the transistor $\alpha$ parameters.

In summary, whenever the clock signal is in the logic 0 state, the voltage on base 66 of transistor 60, which is located in master section 40, also appears on base 74 of transistor 76, which is in slave section 42. The transition of the clock signal from the logic 1 state to the logic 0 state causes, therefore, a transfer of data from master section 40 to slave section 42.

Whenever the clock signal is in a logic 1 state, i.e., the voltage signal applied to positive input terminal 22 is of sufficient magnitude bias transistor 46 in the forward active region, the current "I" flows from the collector 82 to the emitter 84 of transistor 46. The current flowing through collector 82 of transistor 46 flows through either the emitter 86 of transistor 64 or the emitter 88 of transistor 76. This is determined by the magnitude of the voltage on base 74 of transistor 76.

If the voltage on base 74 of transistor 76 is greater than the voltage $V_R$ on base 68 of transistor 64, the current "I" flows through the collector 90 of transistor 76 and no current flows through transistor 64.

If the voltage on base 74 of transistor 76 is less than (i.e., is about $-0.6$ volt) the voltage on base 68 of transistor 64, the current "I" flows through collector 78 of transistor 64 and no current flows through transistor 76.

In summary, whenever the clock signal is in the logic 1 state, the voltage on base 74 of transistor 76 does not change, i.e., there is no data transfer when the clock signal is in the logic 1 state. The data remain, therefore, latched in the latch memory 18. The data input and data output of subcircuit 16 are, respectively, the emitter 92 of the transistor 94 and the emitter 96 of transistor 76. It will be appreciated that each subcircuit provides the current necessary to effect the latch memory function and to drive an input node of ladder network 12.

Whenever it conducts current, the collector 70 of transistor 60 indicates that the bit stored in subcircuit 16 is a logic 1 and delivers a current "I" to the input node 102. Similarly, whenever it conducts current, the collector 70' of transistor 60' indicates that the bit stored in subcircuit 14 is a logic 1 and delivers a current "I" to the input node 100. Input node 100 represents the most significant bit (MSB), and input node 102 represents the next most significant bit (MSB -1) of the digital word.

The contribution of the voltage that develops on an input node from the current "I" flowing through a subcircuit of latch memory 18 equals one-half of that on the input node corresponding to the next most significant bit. For example, such voltages on input nodes 100 and 102 equal $\frac{2}{3}$ ($I \times R$) and $\frac{1}{3}$ ($I \times R$), respectively. Of course, whenever no current "I" flows from a subcircuit of latch memory 18, an open circuit voltage appears on that input node.

Ladder network 12 synthesizes, therefore, an analog signal which appears on output terminal 104 of ladder network 12 and which represents the weighted value of the digital input word stored in latch memory 18. Typical values of the components used in the preferred embodiment are I=0.5 mA, $R_L$=600 ohms, $V_R$=$-0.3$ volt, $V_{EE}$=$-5.2$ volts, $V_{CC}$=0 volts, $V_{LADDER-REF}$=$+1$ volt, R=1.5 kilohms, and 2R=3 kilohms. $V_{LADDER-REF}$ must be greater than $V_{CC}$ by an amount that is sufficient to prevent the saturation of the emitter follower transistors (i.e., transistors 60, 64, 76, and 94).

It will be obvious to those having skill in the art that many changes may be made to the details of the above-described preferred embodiment of the present invention without departing from the underlying principles thereof. For example, the R-2R resistive ladder network is for converting digital words in binary format. The present invention can also be used with ladder networks of digital words in other number systems, such as binary coded decimal. Moreover, the current "I" can be provided from the slave section of a latch memory subcircuit. In the case of subcircuit 18, the current "I" would be delivered to node 102 from collector 90 of transistor 76 and collector 70 of transistor 60 would be connected to $V_{CC}$. The scope of the present invention should be determined, therefore, only by the following claims.

I claim:

1. A combined digital-to-analog converter and latch memory circuit, comprising:

a resistive ladder network having plural input nodes and an output, each of the input nodes corresponding to a different bit of a digital word;

plural current-controlled latch subcircuits, each of the latch subcircuits using an amount of current to control the operation thereof and having a current output for delivering the amount of current to one of the input nodes to represent the logic state of a corresponding one of the bits, thereby to store in the latch subcircuits the logic states of the bits of the digital word and to provide at the output an analog signal that corresponds to the weighted value of the digital word, said latch subscripts being mutually coupled in a series, and each having a data input and a data output, the data output of one of said latch subcircuits being coupled to the data input of the next adjacent latch subcircuit in the series to form a serial shift register; and positive and negative clock input terminals for receiving a differential clock signal such that said latch subcircuits are responsive to the clock signal in order to store data applied to their inputs.

2. The circuit of claim 1 in which each of said latch subcircuits includes a master current mode logic element of the emitter function logic type, and a slave current mode logic element of the emitter function logic type.

3. The circuit of claim 2 in which said master current mode logic element comprises:
- a first transistor having a base, a collector and first and second emitters, the first emitter forming the data input, the base being coupled to a reference voltage, and the collector being coupled to a supply voltage through a load resistor;
- a second transistor having a base, a collector and first and second emitters, the first emitter forming the data output, the second emitter being coupled to the second emitter of said first transistor, and the base being coupled to the collector of said first transistor, and the collector forming the current output; and
- a pair of emitter coupled transistors having first and second bases, first and second collectors, and an emitter terminal, the first base being coupled to said positive clock input terminal, the second base being coupled to said negative clock input terminal, the first collector being coupled to the data input, the second collector being coupled to the coupled second emitters of said first and second transistors, and the emitter terminal being coupled to a source of constant current.

4. The circuit of claim 2 in which said slave current mode logic element comprises:
- a first transistor having a base, a collector and first and second emitters, the first emitter forming the data input, the base being coupled to a reference voltage, and the collector coupled to a supply voltage through a load resistor;
- a second transistor having a base, a collector and first and second emitters, the first emitter forming the data output, the second emitter being coupled to the second emitter of said first transistor, the base being coupled to the collector of said first transistor, and the collector forming the current output; and
- a pair of emitter coupled transistors having first and second bases, first and seond collectors, and an emitter terminal, the first base being coupled to said negative clock input terminal, the second base being coupled to said positive clock input terminal, the first collector being coupled to the data input, the second collector being coupled to the coupled second emitters of said first and second transistors, and the emitter terminal being coupled to a source of constant current.

* * * * *